US009170307B2

(12) United States Patent
Ausserlechner

(10) Patent No.: US 9,170,307 B2
(45) Date of Patent: Oct. 27, 2015

(54) HALL SENSORS AND SENSING METHODS

(71) Applicant: INFINEON TECHNOLOGIES AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 523 days.

(21) Appl. No.: 13/627,468

(22) Filed: Sep. 26, 2012

(65) Prior Publication Data

US 2014/0084911 A1   Mar. 27, 2014

(51) Int. Cl.
  *G01B 7/30* (2006.01)
  *G01R 33/06* (2006.01)
  *G01R 33/07* (2006.01)
(52) U.S. Cl.
  CPC .............. *G01R 33/07* (2013.01); *G01R 33/075* (2013.01); *G01R 33/077* (2013.01)
(58) Field of Classification Search
  CPC ..... G01R 33/07; G01R 33/075; G01R 33/077
  USPC ....................... 324/251, 207.2, 207.12, 117 H
  See application file for complete search history.

(56) References Cited

U.S. PATENT DOCUMENTS

| 3,823,354 | A | 7/1974 | Janssen |
|---|---|---|---|
| 4,041,026 | A | 8/1977 | Ogata |
| 5,747,995 | A | 5/1998 | Spies |
| 6,064,202 | A | 5/2000 | Steiner et al. |
| 6,184,679 | B1 | 2/2001 | Popovic |
| 6,727,563 | B1 | 4/2004 | Hohe |
| 6,768,301 | B1 | 7/2004 | Hohe et al. |
| 7,425,821 | B2 | 9/2008 | Monreal et al. |
| 7,782,050 | B2 | 8/2010 | Ausserlechner |
| 7,872,322 | B2 | 1/2011 | Schott |
| 8,030,918 | B2 | 10/2011 | Doogue et al. |
| 8,093,891 | B2 | 1/2012 | Rocznik |
| 8,114,684 | B2 | 2/2012 | Rocznik et al. |
| 8,829,900 | B2 | 9/2014 | Ausserlechner |
| 8,896,303 | B2 | 11/2014 | Ausserlechner |
| 8,922,207 | B2 * | 12/2014 | Ausserlechner .............. 324/251 |

(Continued)

FOREIGN PATENT DOCUMENTS

| CN | 101762796 A | 6/2010 |
|---|---|---|
| CN | 101923266 A | 12/2010 |

(Continued)

OTHER PUBLICATIONS

German Examination Report for German Application No. 102013110633.1 dated May 27, 2014. English translation not available.

(Continued)

*Primary Examiner* — Reena Aurora
(74) *Attorney, Agent, or Firm* — Eschweiler & Associates, LLC

(57) ABSTRACT

Embodiments relate to multi-terminal sensor devices and operating methods thereof that can reduce or eliminate offset error. In embodiments, sensor devices can comprise three or fewer terminals, and multiple such sensor devices can be combined. The sensor devices can comprise Hall sensor devices, such as vertical Hall devices, or other sensor devices in embodiments. Operating modes can be implemented for the multi-terminal sensor devices which offer improvements over conventional spinning current techniques, including reduced residual offset.

24 Claims, 12 Drawing Sheets

(56) References Cited

U.S. PATENT DOCUMENTS

| | | |
|---|---|---|
| 2003/0102909 A1 | 6/2003 | Motz |
| 2004/0212029 A1 | 10/2004 | Boor |
| 2005/0258840 A1 | 11/2005 | Ausserlechner |
| 2006/0097715 A1 | 5/2006 | Oohira |
| 2009/0256559 A1 | 10/2009 | Ausserlechner |
| 2010/0002821 A1 | 1/2010 | Hammerschmidt et al. |
| 2010/0123458 A1 | 5/2010 | Schott |
| 2010/0133632 A1 | 6/2010 | Schott |
| 2011/0074405 A1 | 3/2011 | Doogue |
| 2012/0001279 A1 | 1/2012 | Hioka |
| 2012/0169329 A1 | 7/2012 | Hellwig |
| 2013/0015853 A1 | 1/2013 | Raz et al. |
| 2013/0021026 A1 | 1/2013 | Ausserlechner |
| 2013/0069640 A1 | 3/2013 | Ausserlechner |
| 2013/0069641 A1 | 3/2013 | Motz et al. |
| 2013/0127453 A1 | 5/2013 | Ausserlechner et al. |
| 2013/0214775 A1 | 8/2013 | Ausserlechner et al. |
| 2014/0028304 A1 | 1/2014 | Ausserlechner et al. |
| 2014/0210458 A1 | 7/2014 | Ausserlechner et al. |
| 2014/0210461 A1 | 7/2014 | Ausserlechner et al. |

FOREIGN PATENT DOCUMENTS

| | | |
|---|---|---|
| DE | 4141386 | 6/1993 |
| DE | 4302342 | 7/1993 |
| DE | 10150950 | 6/2003 |
| DE | 10150955 | 6/2003 |
| DE | 102006037226 | 2/2008 |
| EP | 1438755 | 1/2005 |
| EP | 2071347 | 6/2009 |
| EP | 2192417 | 6/2010 |
| EP | 2546670 | 1/2013 |
| JP | 1251763 | 10/1989 |
| WO | WO 03036733 | 5/2003 |
| WO | WO 2004025742 | 3/2004 |
| WO | WO 2008/048379 A1 | 4/2008 |
| WO | WO2009050673 | 4/2009 |

OTHER PUBLICATIONS

Ausserlechner, Udo, *Limits of Offset Cancellation by the Principle of Spinning Current Hall Probe*, Infineon Technologies AG, 4 pages, Oct. 2004.

Vanha, Ralph, *Trench-Hall Devices*, Journal of Microelectromechanical Systems, vol. 9, No. 1, Mar. 2000, pp. 82-87.

De Jong, Paul C., *40.1 Smart Silicon Sensors—Examples of Hall-effect Sensors*, Sensors 2002 Proceedings of IEEE, 5 pages.

Application and File History for U.S. Appl. No. 13/223,527, filed Sep. 1, 2011 inventor Ausserlechner.

Application and File History for U.S. Appl. No. 13/559,197, filed Jul. 26, 2012 inventors Ausserlechner et al.

Application and File History for U.S. Appl. No. 13/753,190, filed Jan. 29, 2013 inventors Ausserlechner, et al.

Application and File History for U.S. Appl. No. 13/621,336, filed Sep. 17, 2012, inventors Motz et al.

Munter, P J A, *A Low-offset Spinning-current Hall Plate*, Sensors and Actuators, A21-A23, 1990, pp. 743-746.

Popovic, R.S., "Hall Devices for Magnetic Sensor Microsystems", 1997 IEEE International Conference on Solid-State Sensors and Actuators, Chicago, Jun. 16-19, 1997, p. 377-380.

U.S. Appl. No. 13/298,917, Inventor: Udo Ausserlechner, filed Nov. 17, 2011.

U.S. Appl. No. 13/621,336, Inventor: Mario Motz, filed Sep. 17, 2012, 8 pages.

U.S. Appl. No. 13/559,197, Inventor: Udo Ausserlechner, filed Jul. 26, 2012.

Chinese Application No. 2012103459284, Chinese Office Action, mailed Oct. 10, 2014, 7 pages.

Specification, Claims, Abstract, Drawings and Filing Receipt for U.S. Appl. No, 13/920,777, filed Jun. 18, 2013.

* cited by examiner

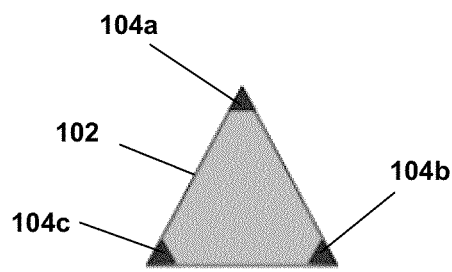
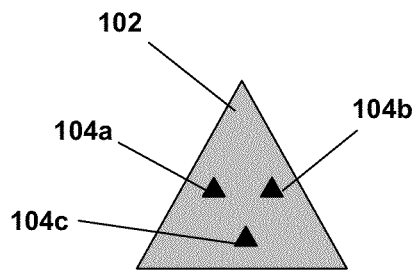
FIG. 1A    FIG. 1B
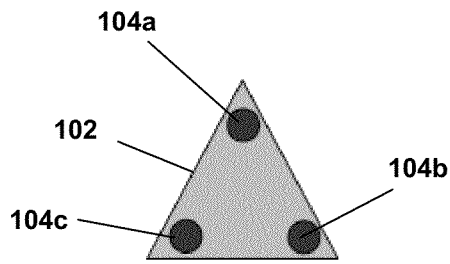
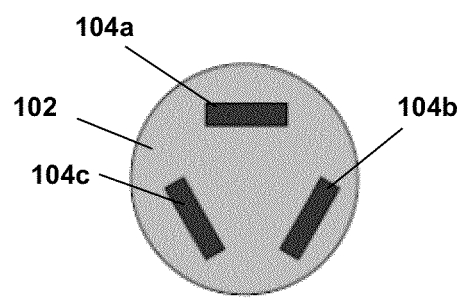
FIG. 1C    FIG. 1D
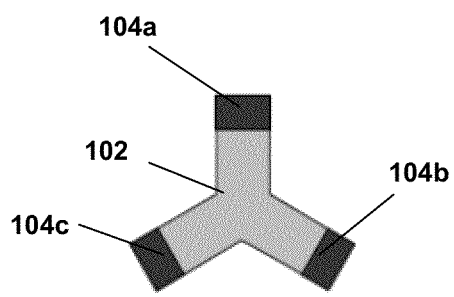
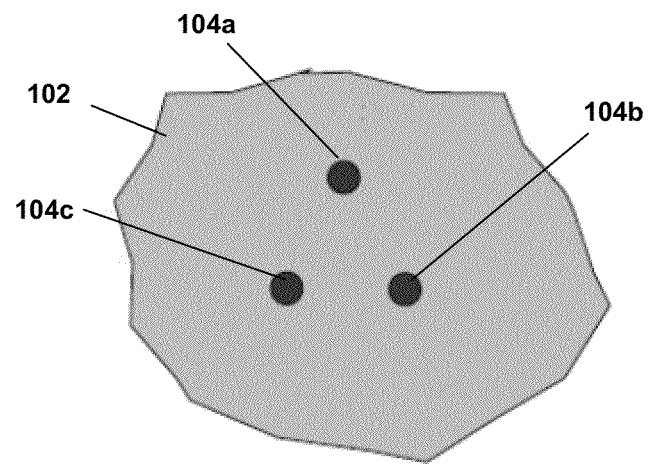
FIG. 1E    FIG. 1F

HALL SENSORS AND SENSING METHODS

TECHNICAL FIELD

The invention relates generally to sensors and more particularly to offset cancellations in Hall sensor devices.

BACKGROUND

Magnetic field sensors, such as Hall sensors, are sensitive to magnetic fields but can suffer from offset error. Offset error is the presence of an output signal in the absence of some input quantity. In an example related to Hall sensors, the offset error would be an output signal indicative of an input magnetic field when in fact no magnetic field is present. Offset error can affect both ordinary Hall devices and vertical Hall devices.

Offset error can relate to different causes, two of which are raw offset error and residual offset error. Raw offset error can refer to an offset error present in a particular operating phase. Residual offset error can refer to an offset error present in an overall or total output signal, such as a signal that is a combination of those from individual operating phases.

One approach for reducing or eliminating offset error is using a multi-terminal Hall sensor. Four-terminal Hall sensors can be operated in a spinning current-type mode, which changes the couplings of the terminals in each of multiple clock phases such that any offset is reduced when the signals from the multiple clock phases are combined. Three-terminal Hall devices typically require use of at least two devices and a modified spinning-current technique in order to be similarly operated. Even so, the residual offset error can remain higher than desired, such as in the range of about 1 milli-Tesla (mT).

SUMMARY

Embodiments relate to reducing residual offset in multi-terminal sensor devices.

In an embodiment, a Hall region comprising no more than three terminals; and circuitry configured to selectively couple at least two of the no more than three terminals as supply terminals and two of the no more than three terminals as signal terminals in each of three operating phases, such that each of the no more than three terminals is coupled as a supply terminal in the same number of operating phases as the others of the no more than three terminals, and each of the no more than three terminals is coupled as a signal terminal in the same number of operating phases as the others of the no more than three terminals.

In an embodiment, a method of operating a magnetic field sensor having no more than three contacts comprises operating the magnetic field sensor in a first operating phase by coupling first and second of the no more than three terminals to a supply of a first level and a third of the no more than three terminals to a supply of a second level, and obtaining a first phase output signal by combining signals sensed at the first and second of the no more than three terminals; operating the magnetic field sensor in a second operating phase by coupling the first and third of the no more than three terminals to a supply of a first level and the second of the no more than three terminals to a supply of a second level, and obtaining a second phase output signal by combining signals sensed at the first and third of the no more than three terminals; operating the magnetic field sensor in a third operating phase by coupling the second and third of the no more than three terminals to a supply of a first level and the first of the no more than three terminals to a supply of a second level, and obtaining a third phase output signal by combining signals sensed at the second and third of the no more than three terminals; and combining the first, second and third phase output signals.

In an embodiment, a magnetic field sensor comprises a first magnetic field sensor device comprising a Hall region and no more than three terminals arranged on the Hall region; a second magnetic field sensor device comprising a Hall region and no more than three terminals arranged on the Hall region; a third magnetic field sensor device comprising a Hall region and no more than three terminals arranged on the Hall region; and circuitry configured to selectively couple the first, second and third magnetic field sensor devices, wherein each of the first, second and third magnetic field sensor devices comprises first, second and third terminals arranged in the same order, and wherein the circuitry is configured to selectively couple the first terminal of the first device, the second terminal of the second device and the third terminal of the third device to form a first overall terminal; the second terminal of the first device, the third terminal of the second device and the first terminal of the third device to form a second overall terminal; and the third terminal of the first device, the first terminal of the second device and the second terminal of the third device to form a third overall terminal.

BRIEF DESCRIPTION OF THE DRAWINGS

The invention may be more completely understood in consideration of the following detailed description of various embodiments of the invention in connection with the accompanying drawings, in which:

FIG. 1A is a diagram of a Hall plate according to an embodiment.

FIG. 1B is a diagram of a Hall plate according to an embodiment.

FIG. 1C is a diagram of a Hall plate according to an embodiment.

FIG. 1D is a diagram of a Hall plate according to an embodiment.

FIG. 1E is a diagram of a Hall plate according to an embodiment.

FIG. 1F is a diagram of a Hall plate according to an embodiment.

Figure 1G:
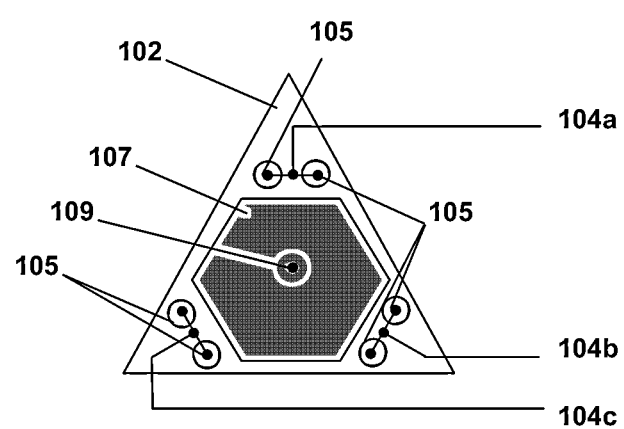
FIG. 1G is a diagram of a Hall plate according to an embodiment.
Figure 2A:
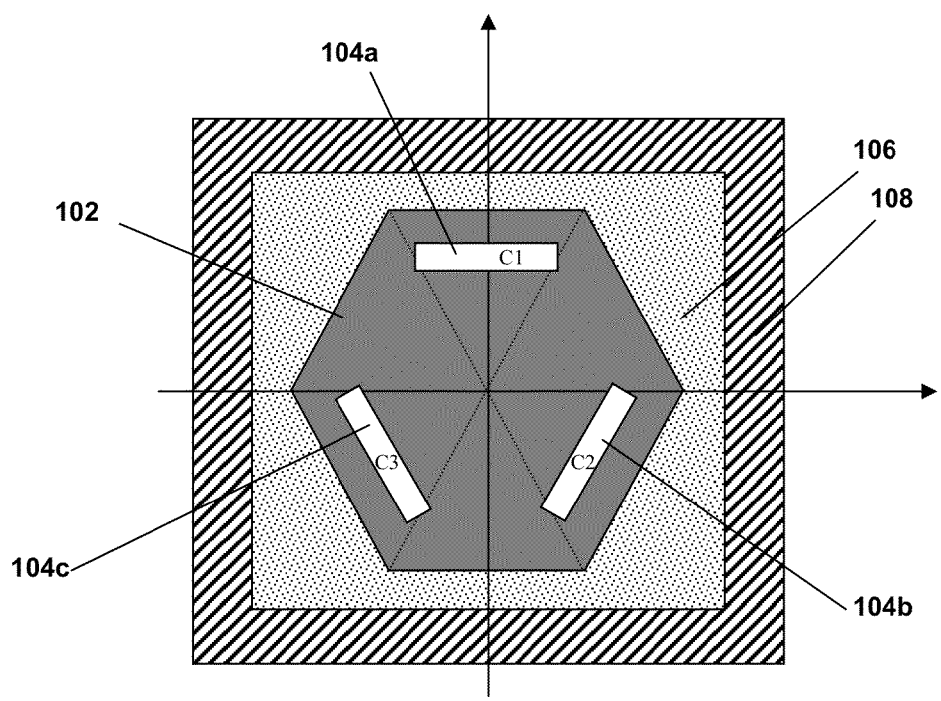
FIG. 2A is a diagram of a Hall plate and isolation structure according to an embodiment.
Figure 2B:
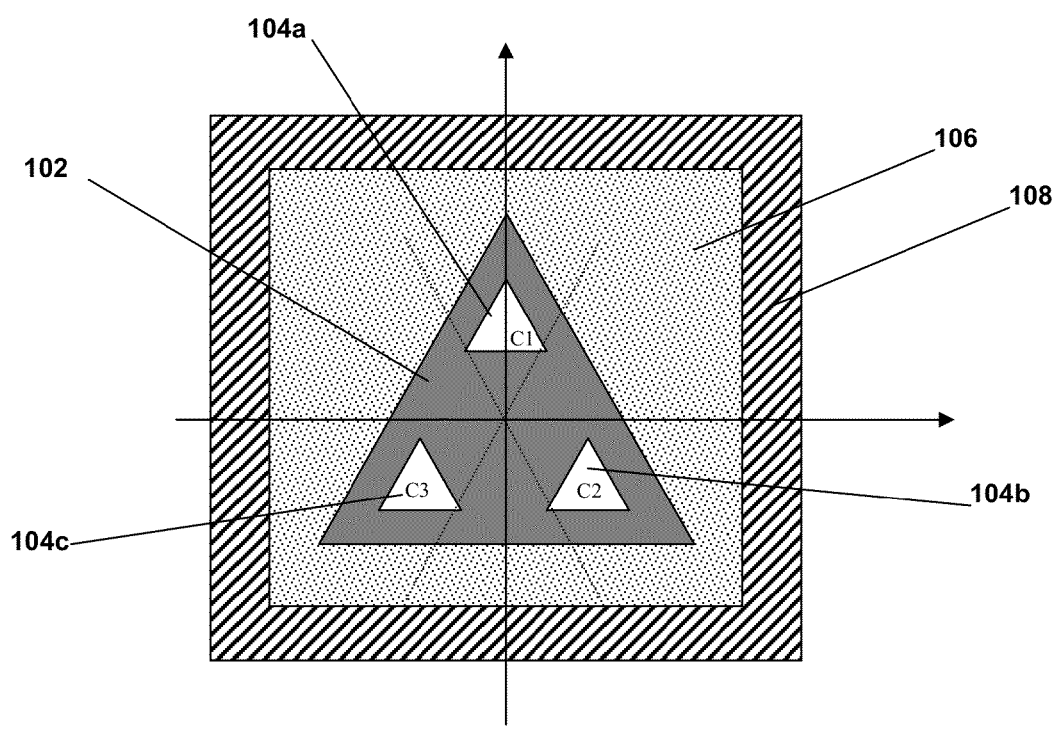
FIG. 2B is a diagram of a Hall plate and isolation structure according to an embodiment.
Figure 2C:
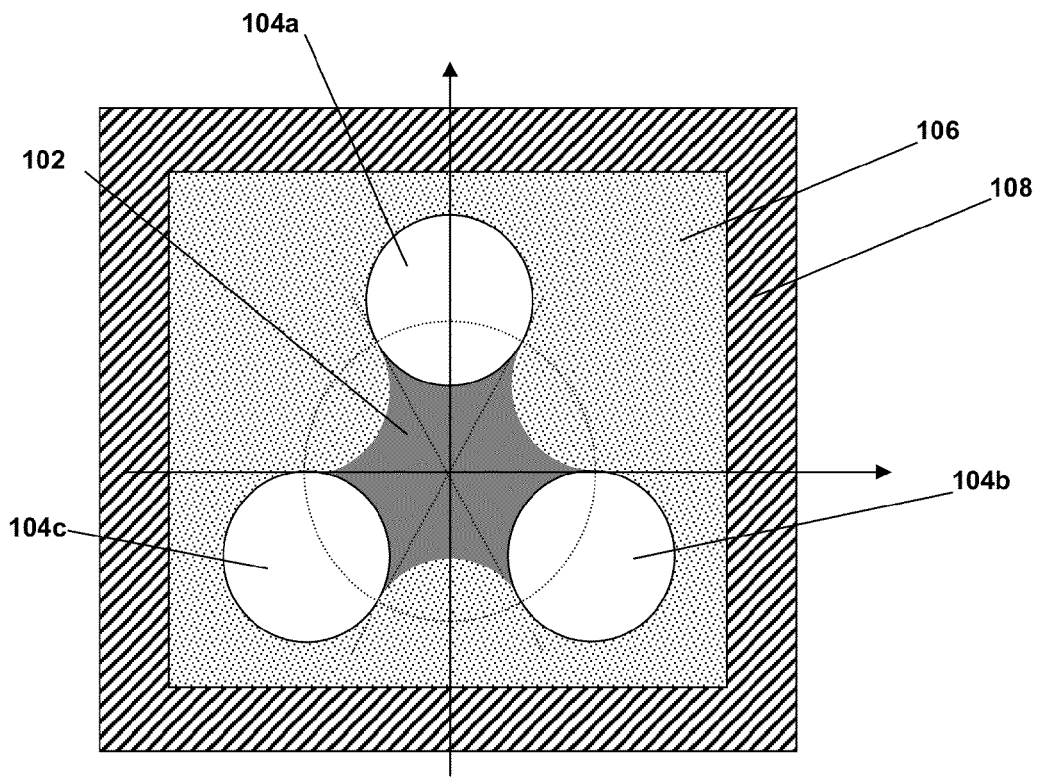
FIG. 2C is a diagram of a Hall plate and isolation structure according to an embodiment.
Figure 2D:
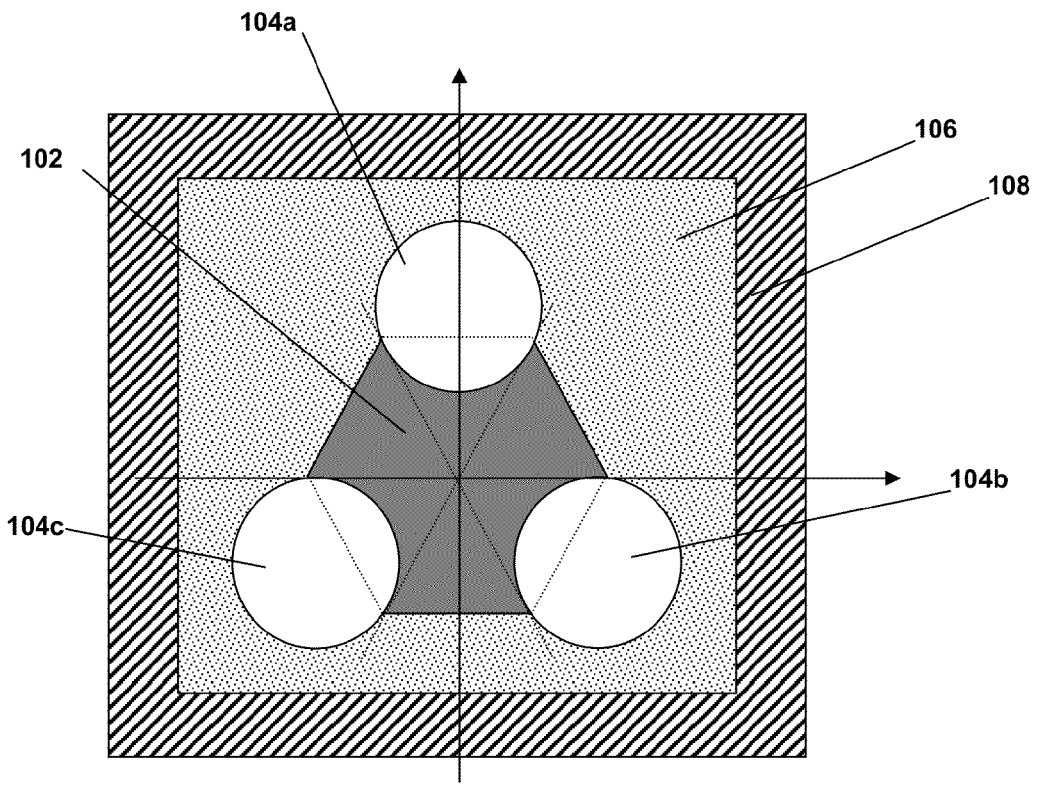
FIG. 2D is a diagram of a Hall plate and isolation structure according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to multi-terminal sensor devices and operating methods thereof that can reduce or eliminate offset error. In embodiments, sensor devices can comprise three or fewer terminals, and multiple such sensor devices can be combined by being coupled together. The sensor devices can comprise Hall sensor devices, such as vertical Hall devices, or other sensor devices in embodiments. Operating modes can be implemented for the multi-terminal sensor devices which offer improvements over conventional spinning current techniques, including reduced residual offset.

As previously mentioned, offset error can relate to different causes, two of which are raw offset error and residual offset error. Raw offset error can refer to an offset error present in a particular operating phase, whereas residual offset error can refer to an offset error present in an overall or total output signal, such as a signal which is a combination of those from individual operating phases. Therefore, raw offset errors in multiple operating phases can be combined to create either an increased residual offset error, which is undesired, or to partially or completely cancel raw offset errors such that the residual offset error is reduced or eliminated.

In embodiments, the multi-terminal sensor devices can comprise Hall sensor devices, such as Hall plate or vertical Hall devices. Each will be discussed below.

Each Hall plate device comprises an active Hall region, which is a three-dimensional shape having lateral dimensions generally larger than vertical one, where lateral in this context refers to a dimension parallel to the surface of a die and vertical is in the thickness direction of the die. The active Hall region comprises a material with a high mobility of charge carriers, such as a region that is mostly n-doped with a low doping concentration between about $10^{14}/cm^3$ and about $10^{17}/cm^3$, a well produced by diffusion of implantation process, or an epitaxial layer in embodiments. The Hall region is defined by its borders, which are typically isolating. For example, for a Hall plate device the bottom is isolating, while for vertical Hall devices the bottom can be isolating or conducting, such as an n-buried layer in an embodiment. The lateral borders of the Hall region are typically though not always isolating.

The terminals of the multi-terminal Hall devices comprise regions with higher conductivity than the active Hall region and which are in Ohmic contact with the active Hall region. Thus, in embodiments the terminals can be highly n-doped regions with doping concentrations at least 10 times larger than in the active Hall region. The terminals can be shallow terminals in embodiments, extending only about 1/10 of the depth of the Hall region, or deeper terminals in other embodiments, extending about 30% to about 100% of the depth of the Hall region.

Hall plate devices generally comprise a relatively shallow Hall plate, tub or region in which the depth of the tub is much less than the lateral dimension. A plurality of terminals, such as three terminals in embodiments, are arranged on or in the Hall plate. Terminals provide the electrical functions of supplying and/or sensing for the Hall plate device. As will be explained below, some terminals can provide both functions of supplying and sensing, while others can provide only one function, e.g. supplying. In an embodiment comprising no more than three terminals, the terminals are equidistantly spaced from a center of the Hall plate at approximately 120-degree intervals. The terminals can be arranged at, near or away from an edge of the Hall plate in various embodiments.

In embodiments comprising vertical Hall devices, the Hall plate generally comprises an elongated tub deeper than the Hall region of a non-vertical Hall device, with a plurality of terminals, such as three, arranged in a surface of the tub. The terminals are typically though not always arranged in a straight line, equally spaced apart from one another. The tub has a depth in embodiments that is greater than a spacing between adjacent terminals. If the die surface on or in which the terminals are arranged is the xy-plane, then the vertical Hall device can detect magnetic fields in the x- or y-direction or some combination thereof.

Referring to FIG. 1, several example Hall plates according to various non-vertical Hall device embodiments are depicted. For example, in FIG. 1A a Hall plate 102 is generally triangular. While Hall plate 102 is depicted as an equilateral triangle, Hall plate 102 can comprise an isosceles or scalene triangle in other embodiments. No more than three terminals 104a, 104b, 104c are spaced apart from one another on plate 102. Terminals 104a-c are galvanic connections between a location on Hall plate 102 and some circuit, supply or element that is external or otherwise does not belong to Hall plate 102. In embodiments, terminals 104a-c are equally spaced at each point of the triangular plate 102. In other embodiments, terminals 104a-c are equally spaced but not located at the points or at all of the points, such as is depicted in FIG. 1B, or are otherwise suitably arranged on plate 102. For example, in FIG. 1C, terminals 104a-c are round rather than triangular and are spaced apart from one another at or near the points of plate 102. Terminals 104a-c can have other shapes and sizes in the embodiments of FIGS. 1A-C, such as square, oval, rectangular or some other shape.

The shape of the Hall region also can vary in embodiments. For example, in FIG. 1D Hall plate 102 is round, and terminals 104a-c are rectangular. In FIG. 1E, Hall plate 102 comprises three spokes, with terminals 104a-c being rectangular and positioned at the tips of each spoke. In FIG. 1F, Hall plate 102 is irregularly shaped and also very large with respect to the area over which terminals 104a-c are arranged. Terminals 104a-c are round and equally spaced near a center area of plate 102. Referring to FIG. 1G, one or more of terminals 104a-c can also comprise multiple contacts. For example, in FIG. 1G each terminal 104a-c comprises two contacts 105. Contacts 105 associated with an individual terminal, for example 104a, are shorted or coupled with another to form that terminal 104a. The embodiment of FIG. 1G also comprises a top plate 107, which covers the active Hall region of Hall plate 102 intermediate contacts 105, and a floating contact 109 arranged between the center of Hall plate 102 and top plate 107 to galvanically couple the two. Referring briefly to the discussion of terminals 104a-c above, contact 109 is not a terminal as that term is used herein. Embodiments can also comprise force-sense contacts, in which a first contact is a force contact and a second contact is a sense contact. Such a pair of force-sense contacts can be used in a feedback loop that forces a voltage or current at the force contact until the potential at the sense contact is equal to a target value. Therefore, the electrical power flows over the force contact, whereas no current follows over the sense contact. A pair of force-sense contacts is also referred to as Kelvin contacts. In such an embodiment, the pair of force-sense contacts comprises a single terminal, as that term is used herein throughout.

In these and other embodiments, the size and shape of plate 102 and the sizes, shapes and placements of terminals 104a-c can vary. For example, the round plate 102 of FIG. 1D can be paired with the round terminals 104a-c of FIG. 1C, or terminals 104a-c of FIG. 1E can be moved toward the middle of plate 102 and/or can be round, square or some other shape. In other words, the plates 102, terminals 104a-c and contacts 105 of FIG. 1 are merely several examples, with many other possibilities available, as appreciated by those skilled in the art.

For example, the Hall plate 102 can be unbounded, with the contacts formed or placed on the top of a die. In another embodiment, and as discussed below with respect to at least FIG. 1, the Hall plate 102 is isolated from other portions of the circuitry and components forming or comprising the semiconductor die. This isolation can be lateral, vertical or both in embodiments.

Referring to FIG. 2, examples of embodiments utilizing p-isolations are depicted. Because the p-isolations can suffer from inaccuracies, in embodiments distances between the contacts of the Hall plate and the p-isolation are kept sufficient. This arrangement can also, e.g., reduce electrical non-linearities of the Hall plate device caused by the voltage-dependent depletion layer at the reverse-biased pn-junction. In FIG. 2A, a Hall plate 102 having three terminals 104a, 104b, 104c is depicted. Hall plate 102, which is an n-region with terminals 104a-c being n+ contacts, is surrounded by a p-tub 106 and p-trench 108. Thus, the p-tub can have a smaller depth than the active Hall region, Hall plate 102. Other similar embodiments are depicted in FIGS. 2B, 2C and 2D.

Thus, in embodiments, the Hall plate comprises a generally flat, plate-like structure of some shape, with the depth of the Hall plate being small with respect to a spacing between the contacts in or on the Hall plate. In general, each Hall plate, however shaped, sized and configured, comprises a plurality of terminals, such as three as depicted in FIG. 1.

Figure 3:
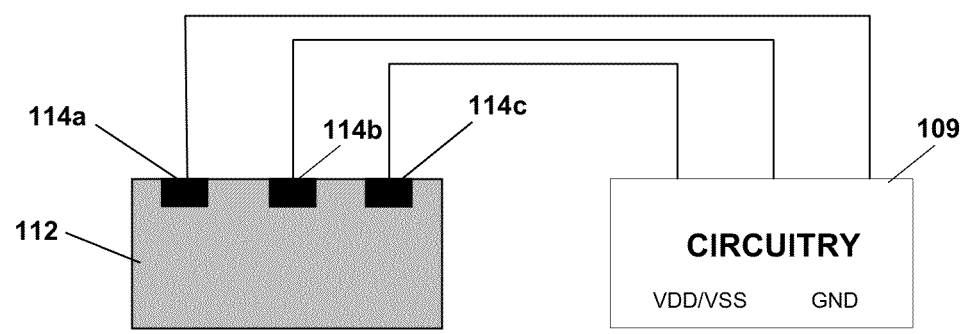
FIG. 3 is a diagram of a vertical Hall device according to an embodiment.

Referring to FIG. 3, a vertical Hall device 112 is depicted in cross-section. Vertical Hall device 112, like Hall plate 102, comprises a plurality of terminals, such as three 114a, 114b, 114c, arranged on a top surface of device 112 as depicted in FIG. 3.

Regardless of the configuration of region 102 (or vertical Hall device 112) and terminals 104a-c (or contacts 114a-c), a Hall sensor can be operated, in use, in a spinning current-like mode. A spinning current operating mode is one in which multiple operating phases are implemented, and the terminals of a device are coupled in different ways, such as with one or more supplies of electrical energy, including positive, negative and ground supplies, in each operating phase. In embodiments, the supplies of electrical energy can be voltage supplies or current supplies. For example, first and second terminals can be coupled to one or more supplies of a first level, such as a positive or negative voltage or current supply, and a third terminal can be coupled to a supply of a second level, such as ground, in one embodiment. The supplies can be the same source or two different sources in embodiments. In general, in an embodiment comprising no more than three terminals, at least two of the three terminals are used to supply electrical energy and at two are also used to derive an output signal, regardless of whether those terminals respond to a magnetic field, in each operating phase. Therefore, at least one terminal functions as both a supply and a sense terminal in each operating phase in embodiments.

Output signals from each operating phase can then be combined to obtain a total output signal. In the example mentioned in the preceding paragraph comprising two terminals coupled to a supply of a first level and a third to a supply of a second level, for example, signals at each of the supply terminals can be measured, such that each also functions as a signal terminal, and a difference between the signals can be the output signal in each individual phase, with the output signals from each phase then being combined. Regardless of voltage or current supply, offset and other errors that may be present in each operating phase can be reduced or canceled in obtaining the total output signal.

The Hall sensor can comprise, in embodiments, a Hall plate device, comprising a Hall plate 102 and terminals 104a-c as depicted in any of FIGS. 1A-1E, or a vertical Hall device 112 such as the one depicted in FIG. 3. Embodiments of the spinning current mode-like approach discussed herein are applicable to any of the Hall plates 102 of FIG. 1 or the vertical Hall device 112 of FIG. 3, though for convenience will be discussed first with reference to FIGS. 1A and 4. While the Hall plate 102 of FIG. 1A is used in the discussion below, the spinning current mode is equally applicable to the devices of FIGS. 1B-1E and 3, and others, and can be implemented in the same way. Therefore, the examples discussed with respect to FIG. 1 are in no way limiting or limited to Hall plate rather than vertical Hall or other devices.

Figure 4:
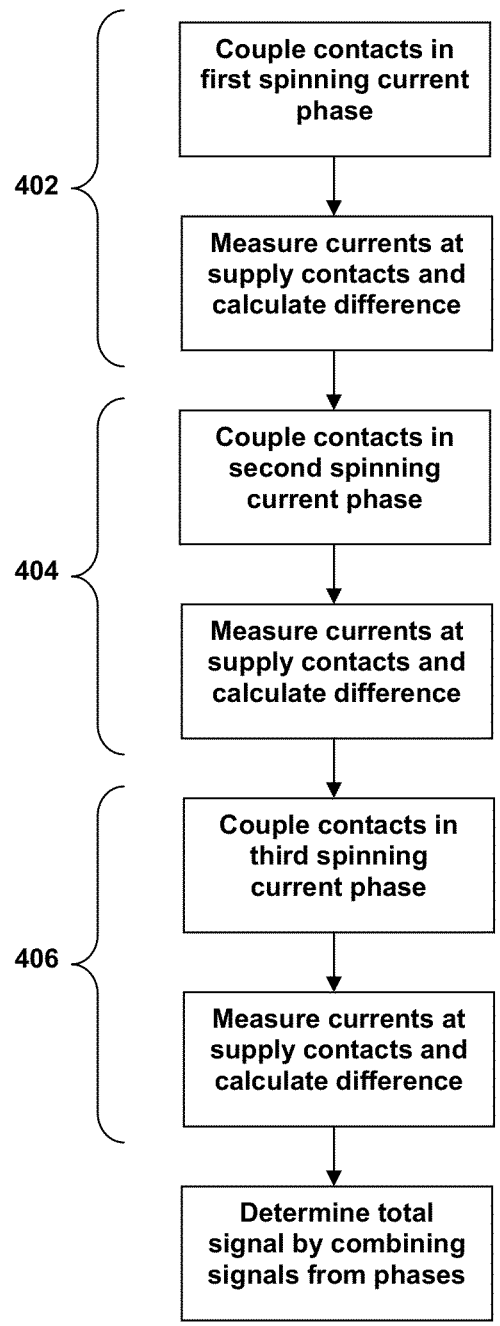
FIG. 4 is a flowchart of a spinning current technique according to an embodiment.

Referring to the Hall plate 102 of FIG. 1A and the flowchart of FIG. 4, an embodiment of a spinning current mode of operation of Hall plate 102 is as follows. At 402, a first spinning current phase is implemented. Two terminals, such as terminals 104a and 104c, are coupled respectively to one or more supplies at a first level, such as voltage supplies, and the third contact, here terminal 104b, is coupled to a supply at a second level, such as ground or some other reference potential. In an embodiment, the supply voltages coupled to terminals 104a and 104c are identical. Coupled as such, about half of the current flows to terminals 104a and 104c, and the difference between the two currents in each spinning current phase, e.g., Ia_1 and Ic_1 in phase 1, is proportional to the magnetic field, with the magnetic field changing the proportion of current flowing from one contact or the other. The current flowing into each of terminals 104a and 104c, Ia_1 and Ic_1, respectively, can then be measured and a phase 1 output current, I1, can be calculated by subtracting one from the other, e.g., I1=Ia_1−Ic_1.

Figure 5A:
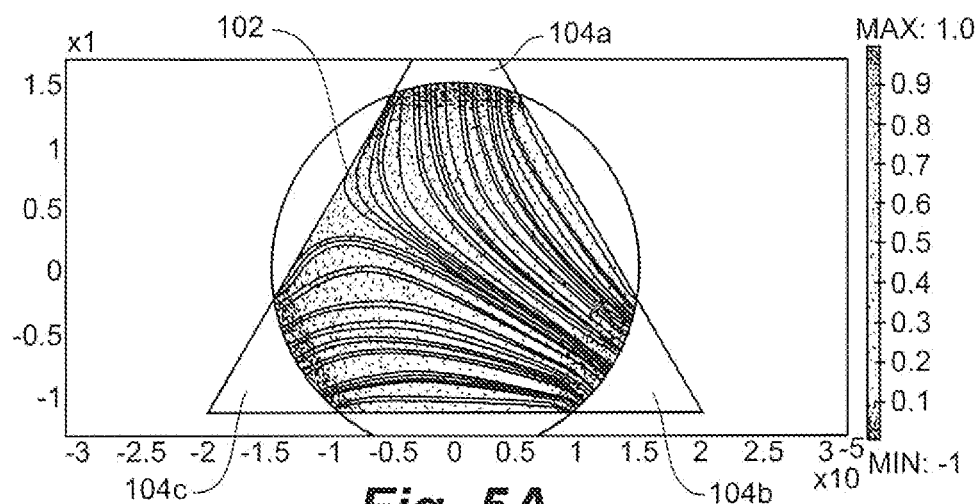
FIG. 5A is a simulation result of a first spinning current phase according to an embodiment.

In an example simulation embodiment, and referring to FIG. 5, a Hall plate similar to that depicted in FIG. 1A is used, having sides of approximately 40 micrometers in length and a thickness of about 0.9 micrometers. Terminals 104a-c can have curved internal edges as depicted in FIG. 5, though in other embodiments they can be straight as in FIG. 1A. For example, drawing a theoretical circle as depicted in FIG. 5, having a diameter of about 30 micrometers centered over the triangle, would result in the three terminals 104a-c as depicted in FIG. 5. The size and configuration of plate 102 and/or terminals 104a-c can vary, with different arrangements providing different internal resistances, noise ratios and other parameters. In such an embodiment, a supply voltage of about 1V is applied to terminals 104a and 104c in phase 1 (FIG. 4A), and terminal 104b is coupled to a reference voltage, such as ground, with a magnetic field of 1T in the z-direction, i.e., perpendicular to the surface of the die depicted in the xy-plane on the page. The magnetic sensitivity is about 8.36 $\mu$A/V/T. In phase 1, Ia_1 is about 7.64E-05 A, Ic_1 is about 6.80E-05 A and I1 is about 8.36E-06 A.

At 404, a second spinning current phase is implemented. Terminals 104a and 104b are coupled to supply voltages of a first level, and terminal 104c is coupled to a supply voltage of a second level, such as ground. The current flowing into each of terminals 104a and 104b, Ia_2 and Ib_2, respectively, can then be measured and a phase 2 output current, I2, can be calculated by subtracting one from the other, e.g., I2=Ia_2−Ib_2.

Figure 5B:
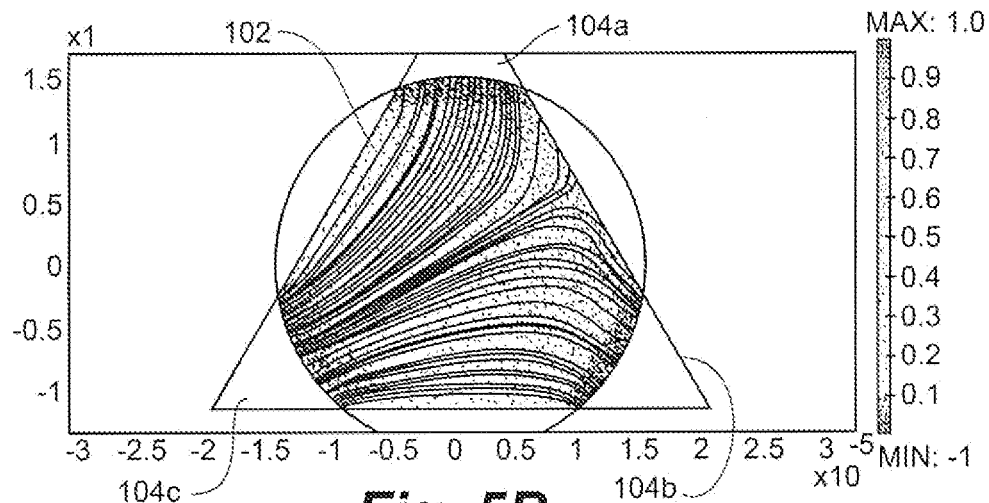
FIG. 5B is a simulation result of a second spinning current phase according to an embodiment.

Returning to the example simulation embodiment of FIG. 5, in phase 2 (FIG. 5B) the magnetic field and supply voltages are the same. Then, Ia_2=6.80E-05 A, Ib_2=7.64E-05 A and I2=−8.35E-06 A.

At 406, a third spinning current phase is implemented. Terminals 104b and 104c are coupled to a supply voltage of a first level, and terminal 104a is coupled to a supply voltage of a second level, such as ground. The current flowing into each of terminals 104b and 104c, Ib_3 and Ic_3, respectively, can then be measured and a phase 3 output current, I3, can be calculated by subtracting one from the other, e.g., I3=Ib_3−Ic_3.

Figure 5C:
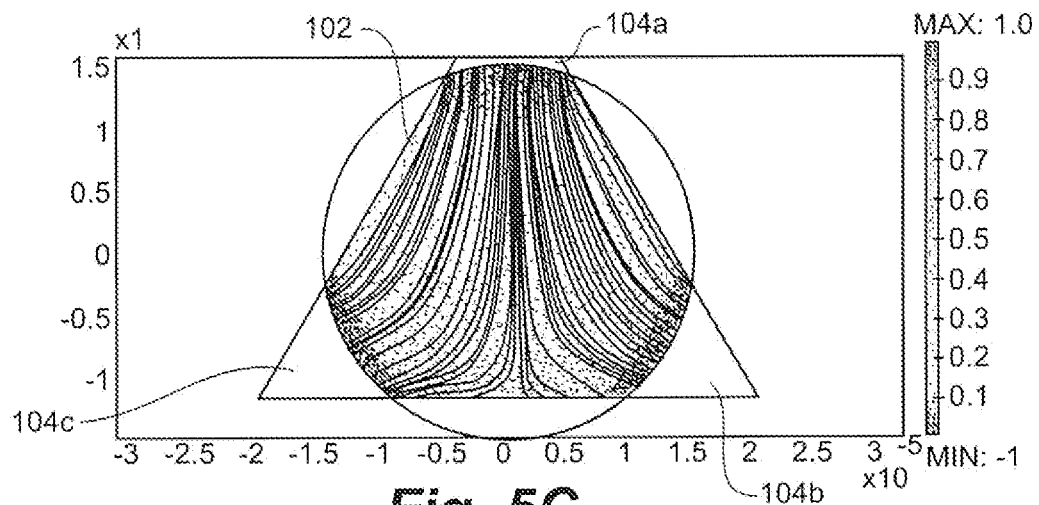
FIG. 5C is a simulation result of a third spinning current phase according to an embodiment.

Returning to the example embodiment of FIG. 5, in phase 3 (FIG. 5C) the magnetic field and supply voltages are the same. Then, Ib_3=6.80E-05 A, Ic_3=7.64E-05 A and I3=−8.36E-06 A.

A total output signal, Ioutput, can then be calculated from the individual outputs of each phase, I1, I2 and I3. In an embodiment, Ioutput=I1−I2−I3. The use of multiple spinning current phases and the combination of phase output signals for a single total output single functions to substantially reduce or eliminate the offset.

In embodiments, the particular couplings or order of phases can vary. For example, the phases can be implemented in the order of 3, 1, 2 or some other order. Additionally, the couplings of terminals, supplies of a first level and supplies of a second level in any particular phase can vary in embodiments. In other words, the particular couplings and phases discussed herein are merely exemplary of one embodiment and do not limit the general concept, system or methodology in other embodiments.

Returning to the vertical Hall embodiment of FIG. 3, a single device can be used in embodiments, or multiple devices can be combined. Combining multiple vertical Hall devices can compensate for the asymmetry of vertical Hall device 112, which can result in the two currents being supplied to vertical Hall device being large and having opposing signs even at zero magnetic field. In the embodiment of FIG. 3, the currents flowing into terminals 114a and 114b are different even though the same potential is applied to each terminal 114a and 114b at zero magnetic field. This causes a large raw offset current in this operating phase, though there are two other operating phases. In one, terminals 114a and 114c are at the same potential and the raw offset is small because device 112 is symmetric with respect to this operating condition. In the other, however, terminals 114b and 114c are at the same potential and the raw offset is again large. If the signals of all three operating phases are combined, the raw offsets cancel theoretically, though practically speaking they do not cancel entirely because of circuit imperfections and other realities. If the device can be made more symmetric, therefore, the raw offsets themselves can be reduced.

Figure 6:
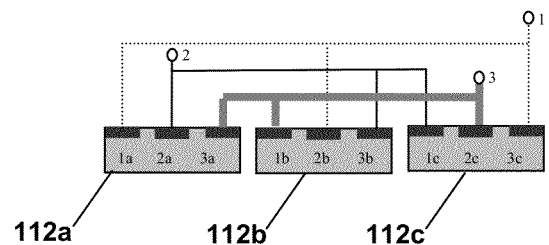
FIG. 6 is a diagram of a coupling arrangement of three vertical Hall devices according to an embodiment.

Therefore, multiple vertical Hall devices 112a, 112b, 112c can be coupled together as depicted in FIG. 6 to improve symmetry and reduce raw offset. In FIG. 6, each of devices 112a-c are generally identical, and each comprises three terminals arranged in the same order on each device 112a-c. In other words, device 112a has three terminals, 1a, 2a and 3a arranged left to right as depicted on the page, device 112b has three terminals 1b, 2b and 3b arranged left to right, and device 112c has three terminals 1c, 2c and 3c arranged left to right. The coupled combination of devices 112a-c can be viewed as a single Hall device having three terminals, 1, 2 and 3 as depicted, for use with the spinning current phase technique discussed herein. Terminal 1 is a short between terminal 1a of device 112a, terminal 2b of device 112b and terminal 3c of device 112c. Terminal 2 is a short between terminal 2a of device 112a, terminal 3b of device 112b and terminal 1c of device 112c. Terminal 3 is a short between terminal 3a of device 112a, terminal 1b of device 112b and terminal 2c of device 112c. In another operating phase, terminal 1 can be a short between terminals 2a, 3b and 1c; terminal 2 a short between 3a, 1b and 2c; and terminal 31a, 2b and 3c. In yet another operating phase, terminal 3 can be a short between terminals 3a, 1b and 2c; terminal 2 a short between 1a, 2b and 3c; and terminal 3 a short between 2a, 3b and 1c.

In other embodiments, three Hall plate devices can be coupled in the manner depicted in FIG. 6, though the benefits achieved may not be as significant as for vertical Hall embodiments. Even though the geometry might be symmetric, the conductance, for example, can be anisotropic. Moreover, the geometry can still be slightly asymmetrical despite efforts to the contrary because of mask misalignments, under-etching, oblique implantation directions and other manufacturing factors. Nevertheless, such a coupled arrangement of Hall plates can compensate for, e.g., mask misalignments affecting symmetry, mechanical stresses or other factors. Referring to FIG. 7, five example embodiments are depicted. In each embodiment, as well as in others, it can be advantageous in embodiments to rotate each device 102a, 102b, 102c by 60 degrees with respect to each adjacent device, such that devices 102a-c are coupled in such a way that that if a current is applied to each device 102a-c from the first to the second contact, then the third contact of each device 102a-c are on each on the same side, right or left, of the current and the Hall signals each add up rather than cancel.

Additionally, the current in each plate can be rotated by 120 degrees with respect to each adjacent device. For example, referring to FIG. 7A, the current in plate 102b can be rotated 120 degrees with respect to device 102a, while the current in plate 102c is rotated −120 degrees with respect to device 102a. Symmetry can also be considered with respect to "rows" of terminals. For example, in FIG. 7A, six terminals are aligned in a bottom "row" while only three are aligned in a top "row." A doping, temperature or other gradient can therefore have an inordinate detrimental effect on the Hall signal. Therefore, the arrangement of contacts in FIG. 7B, which can be described as having three rows, can be considered in embodiments. Compare also the embodiment of FIG. 7C, which is similar to that of FIG. 7A, with the embodiments of FIGS. 7D and 7E, in which the contacts are more evenly distributed between two rows given the rotation of device 102b.

Figure 7A:
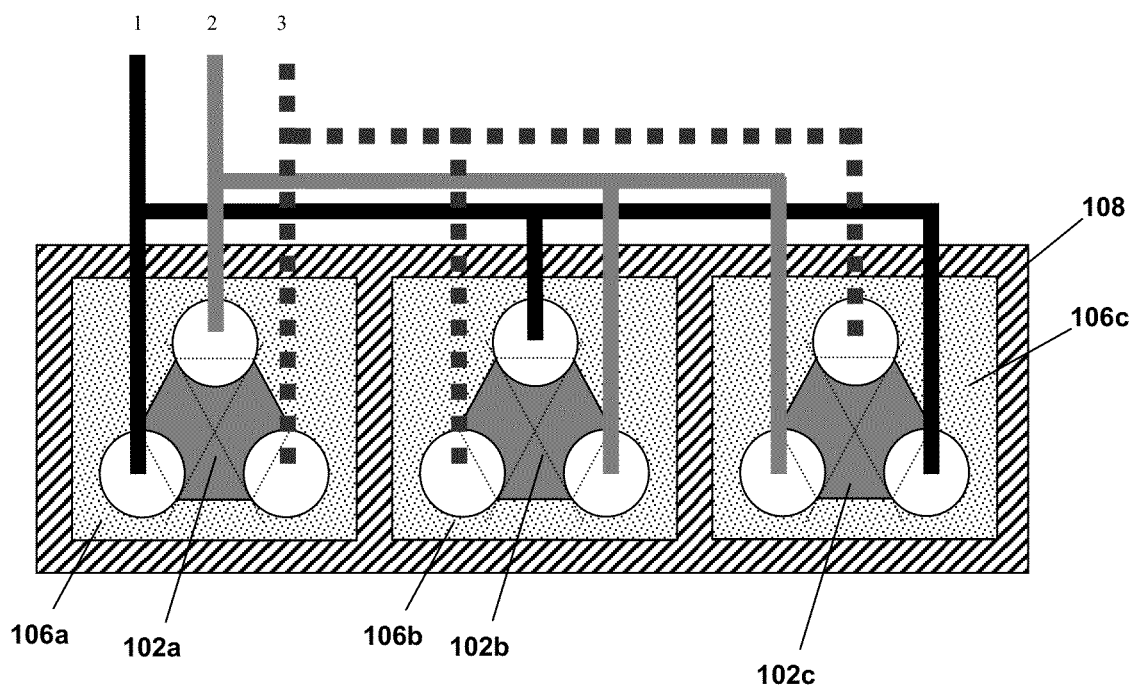
FIG. 7A is a diagram of a coupling arrangement of three Hall plates and isolation structures according to an embodiment.
Figure 7B:
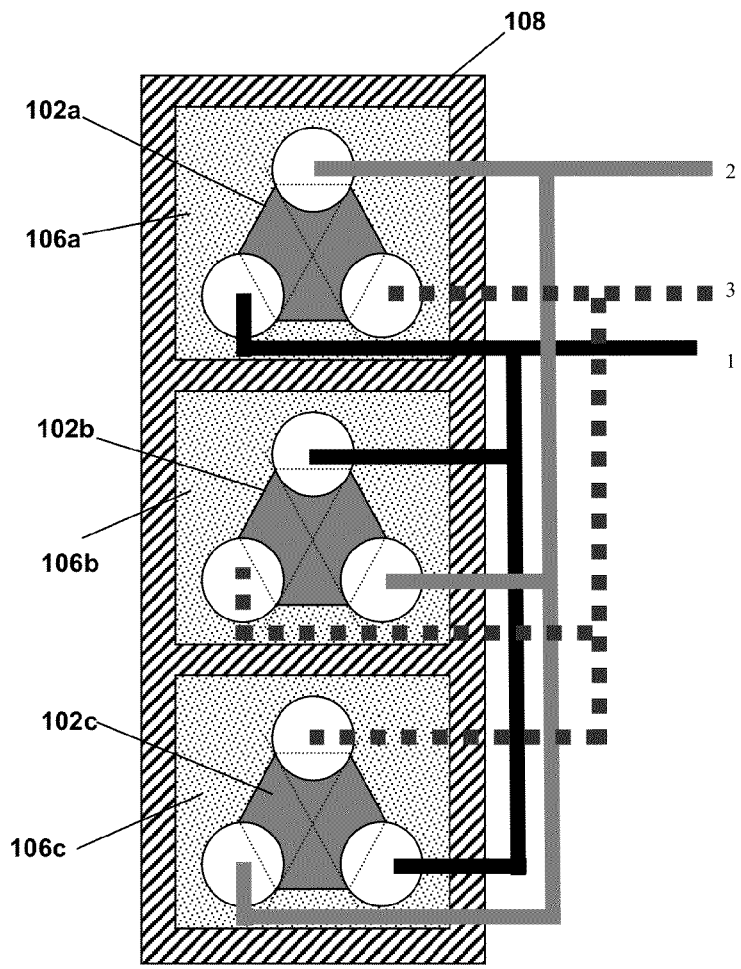
FIG. 7B is a diagram of a coupling arrangement of three Hall plates and isolation structures according to an embodiment.
Figure 7C:
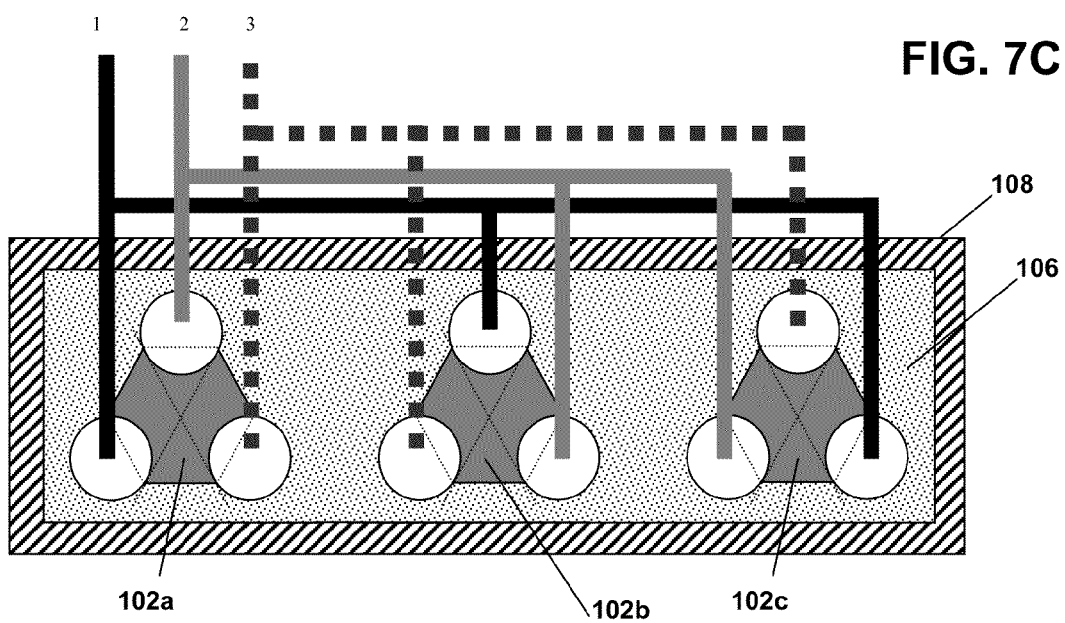
FIG. 7C is a diagram of a coupling arrangement of three Hall plates and isolation structures according to an embodiment.
Figure 7D:
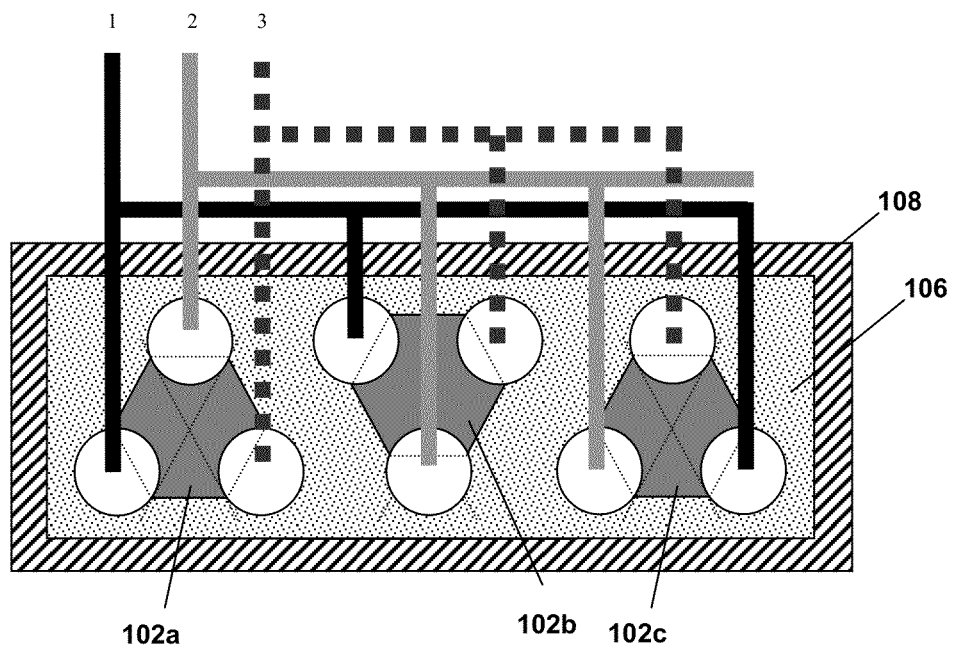
FIG. 7D is a diagram of a coupling arrangement of three Hall plates and isolation structures according to an embodiment.
Figure 7E:
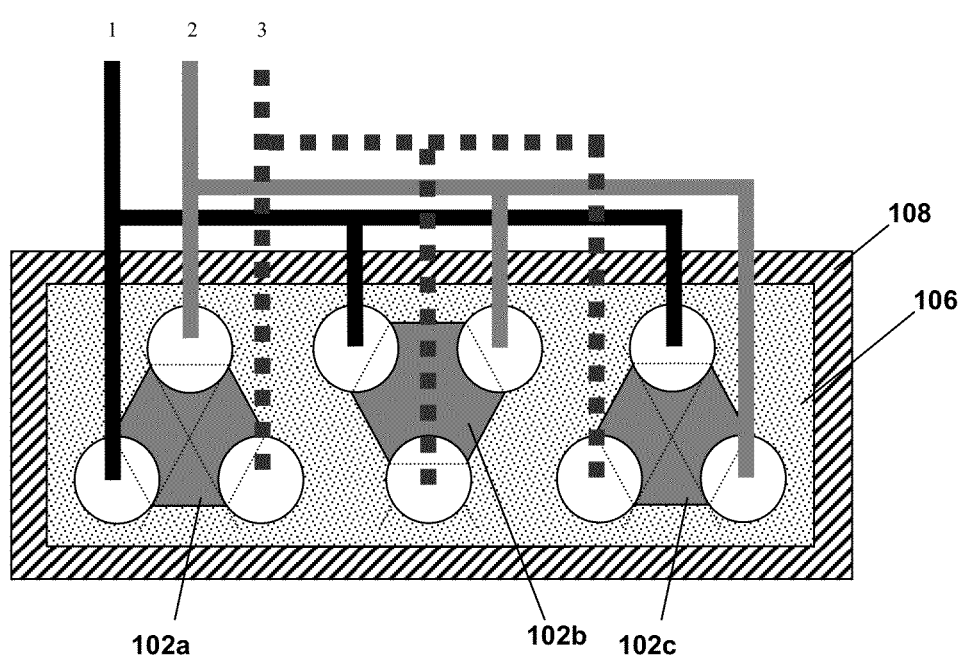
FIG. 7E is a diagram of a coupling arrangement of three Hall plates and isolation structures according to an embodiment.

In FIGS. 7A and 7B, each plate 102a-c has its own tub 106, with trenches 108 arranged between each tub 106l, 106b, 106c. In FIGS. 7C, 7D and 7E, however, plates 102a-c are arranged in a single tub 106 with a single surrounding trench 108. The particular arrangement of tub(s) 106 and trench 108, as well as the particular coupling arrangement of the contacts to provide three contacts from short circuits of a contact from each plate 102a-c, can be selected to maximize magnetic sensitivity, minimize the effects of temperature or mechanical stress or consider other factors in and particular embodiment and/or application. The embodiments of FIG. 7 are merely exemplary of several possibilities and are not limiting with respect to others which can be used.

Additional features can improve practical implementations of the spinning current methodology discussed above. For example, it may not be practical in embodiments to measure the current in each positive supply terminal separately in each phase and then later subtract them, given that the currents are each relatively large with respect to any difference between them. For example, in the simulation example of FIG. 5, each current can be about 70 μA in an embodiment, with a difference between them of only about 80 pA if the applied magnetic field is about 10 μTesla.

Figure 8A:
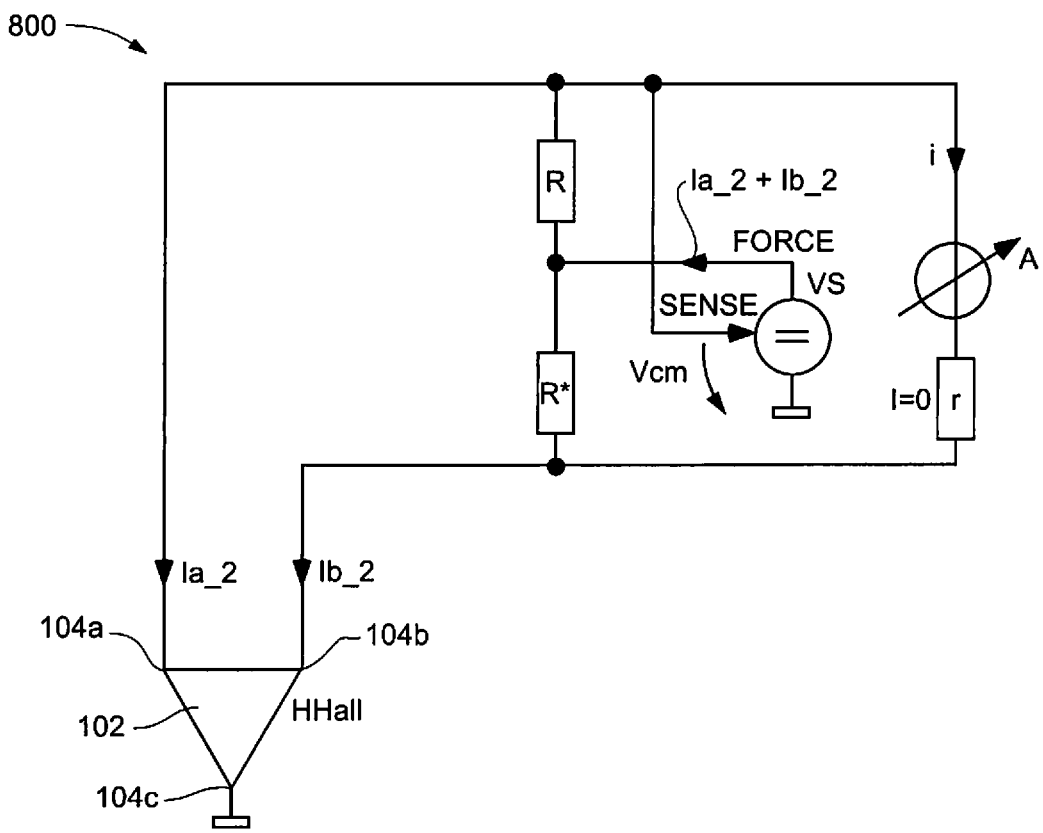
FIG. 8A is a diagram of a biasing and signal extraction circuit according to an embodiment.
Figure 8B:
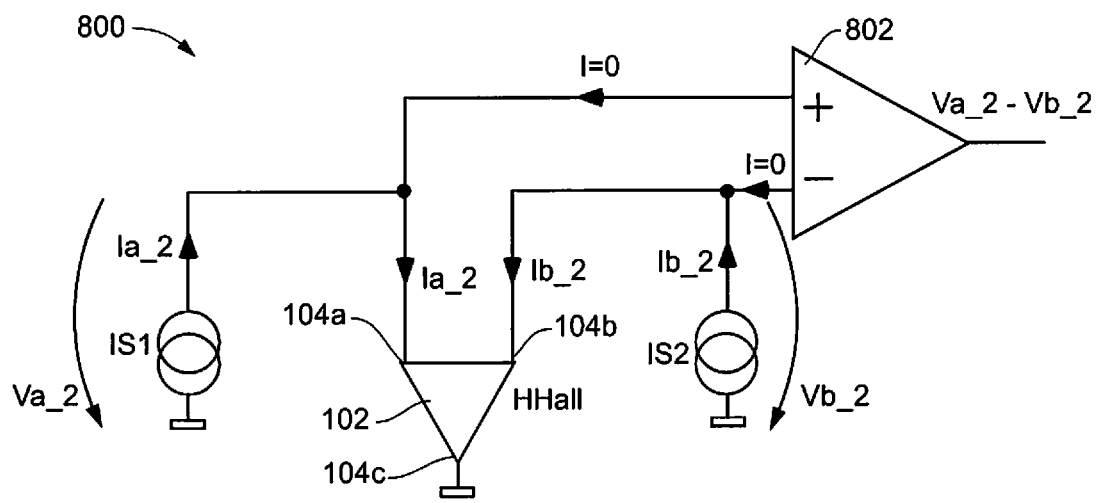
FIG. 8B is a diagram of a biasing and signal extraction circuit having two current sources according to an embodiment.

Referring to FIGS. 8A and 8B, a circuit 800 can be used, coupled to the Hall plate or vertical Hall device (a Hall plate 102 is used for example purposes in FIG. 8), to extract the small current differences from the much larger currents. In particular, circuit 800 comprises a feedback circuit utilizing a common mode feedback configuration to provide two relatively large currents, Ia_2 and Ib_2, to terminals 104a and 104b, with a separate differential feedback portion determines the relatively small differences between the currents without, for example, compounding errors in the currents themselves. Circuit 800 is one example of a suitable circuit, and other circuits can be used in this and other embodiments.

In circuit 800 of FIG. 8A, terminals 104a and 104b are shown in a phase in which each is both a supply and a signal terminal, with each coupled to a supply of a first level (e.g., a positive potential) and an output signal being a difference between signals at each terminal 104a and 104b. Terminal 104c is also a supply terminal, coupled in the depicted phase to a supply of a second level, which can be ground in FIG. 8A. The common mode currents Ia_2 and Ib_2 (a second phase coupling arrangement and notation are used here for convenience of discussion only) to terminals 104a and 104b of Hall plate 102 are supplied by a voltage source VS, which uses force-sense contacts. VS generates a voltage at its force output, which is coupled to a common node of resistances R and R'. In an embodiment, R and R' are identical or very nearly so, though any difference between them is canceled from the final output signal by using the spinning current phase-like approach discussed herein. A voltage Vcm is in turn generated at its sense input. The ammeter A shorts the terminals 104a and 104b, as coupled in FIG. 8A, such that an identical potential appears at each terminal 104a and 104b. The current i measured by ammeter A can be expressed as:

$$i=\{(I1\_2+I2\_2)*(R-R')/2+(I2\_2-I1\_2)*[R+R']\}/\{2*[r+R+R']\}$$

in which r is the internal resistance of the ammeter A itself. As previously mentioned, R=R' in embodiments, and as such the ammeter A measures the difference in currents, with any difference between R and R' being effectively canceled between the multiple phases. In view of the above, the embodiment of FIG. 8° can be regarded as a three-terminal Hall sensor device implemented with two supply terminals being forced in each phase to the same potential. The difference in currents supplied to the forced potential terminals is indicative of the magnetic field signal. It is further to be understood that when applying a spinning current scheme, terminals 104°, 104b, 104c can be interchanged, e.g., rotationally coupled to the supplies in a clockwise, counter-clockwise or some other scheme.

In circuit 800 of FIG. 8B, voltage source VS is replaced with two current sources, IS1 and IS2. IS1 is coupled to terminal 104a, and IS2 is coupled to 104b, such that terminals 104a and 104b are supply terminals. Currents Ia_2 and Ib_2 are respectively provided to terminals 104a and 104b. A comparator 802 compares the voltages, Va_2 and Vb_2, at terminals 104a and 104b, respectively, as signal terminals to obtain an output signal. In view of the above, the embodiment of FIG. 8B can be regarded as a three-terminal Hall sensor device implemented with two supply terminals forced to have the same current. The difference in potentials at the terminals forced to the same current is indicative of the magnetic field signal. It is further to be understood that when applying a spinning current scheme, terminals 104°, 104b, 104c can be rotationally coupled to the supplies in a clockwise, counter-clockwise or some other scheme.

Other embodiments of a biasing and signal extraction circuits suitable for use with embodiments of the devices and spinning current techniques disclosed herein are discussed in co-owned and co-pending U.S. application Ser. No. 13/559,197, which is incorporated herein in its entirety.

Figure 9:
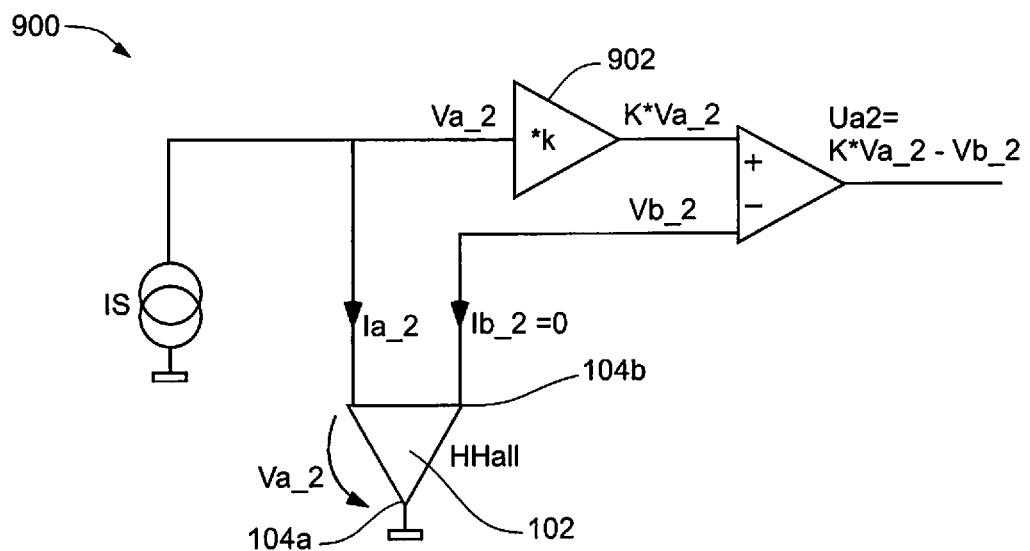
FIG. 9 is a diagram of a biasing and signal extraction circuit according to an embodiment.

While embodiments in which voltage is supplied to the Hall device, whether a horizontal plate or vertical device, and current extract as an output signal have been discussed herein, other embodiments can inject current and extract voltage. One example circuit 900 for such an embodiment is depicted in FIG. 9, in particular an example arrangement for a second of three spinning current phases as discussed herein. The second spinning current phase is depicted and discussed for purposes of example and convenience only. As depicted, terminals 104a and 104c are supply terminals, while terminals 104a and 104b are signal terminals. A current source IS injects a current Ia_2 into terminal 104a of device 102. In the absence of a magnetic field, the output signal at terminal 104b is half of Va_2, the voltage at terminals 104a and 104c if the device is symmetric. To cancel this offset, supply voltage Va_2 is multiplied by a factor k=0.5 at 902 and subtracted from the output voltage Vb_2, which provides the phase 2 output voltage, denoted in FIG. 9 as Ua2 of the spinning current technique. The other spinning current phases can be implemented substantially as discussed herein with respect to other embodiments using the same approach as discussed with respect to FIG. 9, providing the following output signals in each of the three spinning current phases in an embodiment:

$$Ua1=I0*R2*(R1+R3)/(R1+R2+R3)*(k-R1/(R1+R3))-S*Bz$$

$$Ua2=I0*R3*(R1+R2)/(R1+R2+R3)*(k-R2/(R1+R2))-S*Bz$$

$$Ua3=I0*R1*(R2+R3)/(R1+R2+R3)*(k-R3/(R2+R3))-S*Bz$$

in which the z-component of the magnetic field, Bz, is perpendicular to the plane of Hall device 102. Combining the output signals of the three phases provides:

$$Ua1+Ua2+Ua3=I0*(R1*R2+R2*R3+R3*R1)/(R1+R2+R3)*(2*k-1)-3*S*Bz$$

and with k=0.5, the final output signal, absent any offset error, is:

$$Ua1+Ua2+Ua3=-3*S*Bz$$

Embodiments thereby provide spinning current-like techniques for multi-terminal Hall sensor devices, including both Hall plate devices and vertical Hall devices, that reduce or eliminate offset errors. In embodiments, Hall devices having no more than three terminals are operated in three concurrent operating phases, and output signals from each phase are combined which results in reduced or eliminated offset error. In other embodiments, multiple Hall devices can be coupled together and operated in the three operating phases for a similar result.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A magnetic field sensor comprising:
a Hall region comprising no more than three terminals; and
circuitry configured to selectively couple at least two of the no more than three terminals as supply terminals and two of the no more than three terminals as signal terminals in each of three operating phases, such that each of the no more than three terminals is coupled as a supply terminal in the same number of operating phases as the others of the no more than three terminals, and each of the no more than three terminals is coupled as a signal terminal in the same number of operating phases as the others of the no more than three terminals.

2. The sensor of claim 1, wherein the Hall region comprises a Hall plate.

3. The sensor of claim 2, wherein the no more than three terminals are symmetrically arranged on the Hall plate.

4. The sensor of claim 2, wherein the no more than three terminals are equidistantly spaced from one another on the Hall plate.

5. The sensor of claim 1, wherein the Hall region comprises a tub, and the sensor comprises a vertical Hall sensor.

6. The sensor of claim 1, further comprising an isolation tub surrounding the Hall region.

7. The sensor of claim 6, wherein the Hall region comprises an n-Hall region, the no more than three terminals comprise n+-contacts, and the isolation tub comprises a p-tub.

8. The sensor of claim 6, further comprising an isolation trench surrounding the isolation tub.

9. The sensor of claim 1, wherein the no more than three terminals comprise a first terminal, a second terminal and a third terminal, and wherein the circuitry is configured to couple the first terminal and the third terminal as supply terminals of a first level, the second terminal as a supply terminal of a second level, and the first terminal and the third terminal as signal terminals in one of the three operating phases; the first terminal and the second terminal as supply terminals of a first level, the third terminal as a supply terminal of a second level, and the first terminal and the second terminal as signal terminals in another of the three operating phases; and the second terminal and the third terminal as supply terminals of a first level, the first terminal as a supply terminal of a second level, and the second terminal and the third terminal as signal terminals in yet another of the three operating phases.

10. The sensor of claim 1, wherein two terminals of the no more than three terminals comprise signal terminals of a first level, and the circuitry is configured to determine a difference in signals at the two terminals coupled as the signal terminals as an output signal of each operating phase.

11. The sensor of claim 10, wherein the circuitry is configured to combine the output signals of each operating phase to obtain an overall output signal.

12. The sensor of claim 1, wherein the supply is one of a voltage supply or a current supply.

13. The sensor of claim 1, wherein the no more than three terminals comprise a first terminal, a second terminal and a third terminal, and wherein the circuitry is configured to couple at least the third terminal as a supply terminal of a first level, the second terminal as a supply terminal of the second level, and the first terminal and the third terminal as signal terminals in one of the three operating phases; at least the first terminal as a supply terminal of a first level, the third terminal as a supply terminal of a second level, and the first terminal and the second terminal as signal terminals in another of the three operating phases; and at least the second terminal as a supply terminal of a first level, the first terminal as a supply terminal of a second level, and the second terminal and the third terminal as signal terminals in yet another of the three operating phases.

14. A method of operating a magnetic field sensor having no more than three terminals comprising:
  operating the magnetic field sensor in a first operating phase by:
    coupling first and second of the no more than three terminals to a supply of a first level and a third of the no more than three terminals to a supply of a second level, and
    obtaining a first phase output signal by combining signals sensed at the first and second of the no more than three terminals;
  operating the magnetic field sensor in a second operating phase by:
    coupling the first and third of the no more than three terminals to a supply of a first level and the second of the no more than three terminals to a supply of a second level, and
    obtaining a second phase output signal by combining signals sensed at the first and third of the no more than three terminals;
  operating the magnetic field sensor in a third operating phase by:
    coupling the second and third of the no more than three terminals to a supply of a first level and the first of the no more than three terminals to a supply of a second level, and
    obtaining a third phase output signal by combining signals sensed at the second and third of the no more than three terminals; and
  combining the first, second and third phase output signals.

15. The method of claim 14, wherein the magnetic field sensor comprises a Hall effect sensor.

16. The method of claim 15, wherein the Hall effect sensor comprises a vertical Hall effect sensor.

17. The method of claim 14, wherein the positive power supply supplies one of a voltage or a current.

18. The method of claim 14, comprising first and second power supplies, wherein each of the first and second power supplies is used as a power supply coupled to a different one of the no more than three terminals in each of the first, second and third operating phases.

19. A magnetic field sensor comprising:
  a first magnetic field sensor device comprising a Hall region and no more than three terminals arranged on the Hall region;
  a second magnetic field sensor device comprising a Hall region and no more than three terminals arranged on the Hall region;
  a third magnetic field sensor device comprising a Hall region and no more than three terminals arranged on the Hall region; and
  circuitry configured to selectively couple the first, second and third magnetic field sensor devices,
  wherein each of the first, second and third magnetic field sensor devices comprises first, second and third terminals arranged in the same order, and wherein the circuitry is configured to selectively couple the first terminal of the first device, the second terminal of the second device and the third terminal of the third device to form a first overall terminal; the second terminal of the first device, the third terminal of the second device and the first terminal of the third device to form a second overall terminal; and the third terminal of the first device, the first terminal of the second device and the second terminal of the third device to form a third overall terminal.

20. The sensor of claim 19, wherein the Hall regions comprise Hall plates.

21. The sensor of claim 19, wherein the Hall regions comprise vertical Hall devices.

22. The sensor of claim 19, wherein the first, second and third sensor device Hall regions are arranged in an isolation tub.

23. The sensor of claim 19, wherein the first sensor device Hall region is arranged in a first isolation tub, the second sensor device Hall region is arranged in a second isolation tub and the third sensor device Hall region is arranged in a third isolation tub.

24. The sensor of claim 23, wherein adjacent ones of the first, second and third isolation tubs are separated by an isolation trench.

* * * * *